United States Patent [19]
Lee et al.

[11] Patent Number: 5,801,548
[45] Date of Patent: Sep. 1, 1998

[54] CONFIGURABLE PERFORMANCE-OPTIMIZED PROGRAMMABLE LOGIC DEVICE

[76] Inventors: Napoleon W. Lee, 435 Arbor Way, Milpitas, Calif. 95035; Derek R. Curd, 373 River Oaks Cir. #702, San Jose, Calif. 95134

[21] Appl. No.: 630,321

[22] Filed: Apr. 11, 1996

[51] Int. Cl.[6] .............................................. H03K 19/0185
[52] U.S. Cl. ................... 326/44; 326/33; 326/81; 326/86
[58] Field of Search ........................ 326/31, 33, 62–63, 326/81, 83, 44, 86, 21; 327/541, 51

[56] References Cited

U.S. PATENT DOCUMENTS

| | | | |
|---|---|---|---|
| 4,585,955 | 4/1986 | Uchida | 326/33 |
| 5,402,387 | 3/1995 | Hotta | 365/189.05 X |
| 5,408,147 | 4/1995 | Yarbrough et al. | 326/121 X |
| 5,583,457 | 12/1996 | Horiguchi et al. | 327/544 X |
| 5,612,637 | 3/1997 | Shay et al. | 326/86 |

OTHER PUBLICATIONS

Xilinx, Inc., The Programmable Logic Data Book, 1994, Section 3, available from Xilinx, Inc., 2100 Logic Drive, San Jose, California 95124.

*Primary Examiner*—David R. Hudspeth
*Attorney, Agent, or Firm*—Patrick T. Bever; Jeanette S. Harms

[57] ABSTRACT

A programmable logic device (PLD) including configurable circuitry for altering the speed-versus-power characteristics of the PLD after production, and for allowing the PLD to selectively operate on either a 3.3-volt or a 5-volt power supply. The configurable circuitry includes an input buffer, an output buffer and a reference generator. The input buffer includes a dedicated P-channel transistor connected in series with a dedicated N-channel transistor, and a plurality of trip-point adjustment transistors which are selectively connected in parallel with the dedicated transistors to adjust the trip-point of the input buffer by altering the N-to-P ratio. The output buffer includes two configurable buffers whose trip-points are also adjustable. A configurable reference generator is also provided for generating a high precision reference voltage which is supplied to the sense amplifiers located in the function blocks and interconnect matrix of the PLD.

18 Claims, 6 Drawing Sheets

CONFIGURABLE PERFORMANCE-OPTIMIZED PROGRAMMABLE LOGIC DEVICE

BACKGROUND OF THE INVENTION

1. Field of the Invention

The present invention generally relates to programmable logic devices (PLDs), and more particularly to PLDs which are configurable to operate on one of a plurality of operating voltages and to optimize speed-versus-power characteristics.

2. Description of the Prior Art

Several types of programmable logic devices (PLDs) are known in the art. One type of PLD includes an array of function blocks positioned around an interconnect matrix. Input signals are transmitted from device input pins to the interconnect matrix, and are routed by the interconnect matrix to the function blocks. Each function block includes an AND array and a series of macrocells. The AND array receives the input signals from the interconnect matrix and provides product terms to the series of macrocells. Each macrocell includes an OR gate which produces a combinational function based on selected product terms. The combinational functions generated by the series of macrocells are then either fed back to the interconnect matrix for further processing, or transmitted to an output pin of the PLD as an output signal. PLDs which include the above-described circuit structure are referred to by Xilinx, Inc. of San Jose, Calif., as Erasable Programmable Logic Devices (EPLDs) and are described in more detail in Section 3 of The Programmable Logic Data Book (1994) published by Xilinx, which is incorporated by reference herein.

PLDs of the type described above are typically used in systems having either a 5-volt power supply or a low power 3.3-volt power supply. These two different power supplies necessitate the production of two nearly-identical PLDs using two different mask sets, one optimized for 3.3-volt applications, and one optimized for 5-volt applications.

It is recognized in the art that the production of PLDs using two metal masks (i.e., a 3.3-volt metal mask and a 5-volt metal mask) is more expensive than production using a single metal mask. Further, inventory costs related to two different PLDs (one for 3.3-volt applications and one for 5-volt applications) are more expensive than for a single PLD which can be used in both applications. Moreover, a single PLD which can be used in both 3.3-volt and 5-volt applications is more attractive to customers because this PLD provides last-minute design flexibility. Therefore, there is a need for a PLD produced from a single mask set which can operate on either a 3.3-volt or a 5-volt power supply.

In addition, all PLDs of the type described above are "speed binned" according to the signal path speed of the individual devices. That is, variations in production process parameters cause variations in the time required for signals to propagate through the PLDs. For example, a particular production run may produce PLDs having relatively strong P-channel transistors and strong N-channel transistors, thereby yielding fast pin-to-pin path speeds. Conversely, another production run may produce PLDs having relatively weak P-channel transistors and weak N-channel transistors, thereby yielding slower pin-to-pin path speeds. The PLDs produced by the various production runs are tested and rated, or "binned", according to the path speeds, and are then priced accordingly-faster PLDs are typically sold at a premium price, whereas slower PLDs are sold at a reduced price.

It is well known in the PLD art that the faster path speeds result in higher power consumption. Therefore, in some low-power applications, PLDs having slower path speeds are desirable. However, prior art PLDs are produced using the above-mentioned 3.3-volt or 5-volt mask sets, and the availability of "slow" PLDs is dependent upon production process variations. Therefore, a need arises for a single PLD which can be configured after production to operate on both 3.3-volt and 5-volt power supplies, and a method of programmably optimizing the speed-versus-power characteristics of a PLD.

SUMMARY OF THE INVENTION

In accordance with the present invention, a programmable logic device (PLD) includes configurable circuitry which allows the PLD to selectively operate, for example, on either a 3.3-volt or a 5-volt power supply. This flexibility reduces production and inventory costs by providing a single PLD which operates on either power supply. Further, the configurable circuitry allows the manufacturer to alter the reference voltages within individual PLDs, thereby optimizing the PLDs for high-speed operation or low-power operation.

In accordance with a first aspect of the present invention, a PLD includes a plurality of configurable input buffers, each input buffer electrically connected between an input pin and an interconnect matrix of the PLD. Each configurable input buffer includes a dedicated P-channel transistor connected in series with a dedicated N-channel transistor, and a plurality of trip-point adjustment transistors which are selectively connected in parallel with the dedicated transistors to alter the effective ratio of channel widths (N-to-P ratio) of the configurable input buffer. In a default condition, the trip-point adjustment transistors are turned off such that the trip-point of the input buffer is solely controlled by the dedicated transistors whose N-to-P ratio is designed for a default operating voltage (for example, 5 volts). In accordance with the present invention, one or more of the trip-point adjustment transistors are selectively connected in parallel with the dedicated transistors, thereby changing the effective N-to-P ratio of the input buffer. For example, when operation using a secondary operating voltage (for example, 3.3 volts) is desired, one or more of the trip-point adjustment transistors is selectively connected in parallel with the dedicated transistors. Likewise, the trip-point adjustment transistors may be used to "tweak" (i.e., change by a small amount) the trip-point of the input buffer when variations in the process parameters cause the trip-point to occur outside of a desired range.

In accordance with a second aspect of the present invention, a PLD includes a plurality of configurable output buffers, each output buffer being electrically connected between a function block and an output pin of the PLD. Each output buffer includes first and second configurable buffers respectively electrically connected to receive inverted and non-inverted output signals generated by the function block. The first configurable buffer includes an output terminal connected to the gate of a first N-channel transistor whose drain is connected to a predetermined output voltage and whose source is connected to the output pin. The second configurable buffer includes an output terminal connected to the gate of a second N-channel transistor whose drain is connected to the output pin and whose source is connected to ground. Similar to the configurable input buffer, described above, the trip-points of the first and second configurable buffers are selectively adjusted by altering the programmed state of control bits associated with trip-point adjustment transistors of the first and second configurable buffers, thereby allowing optimization of the speed-versus-power characteristics of the configurable output buffer.

In accordance with a third aspect of the present invention, a PLD includes one or more configurable reference generators for generating high precision references voltage which are supplied to sense amplifiers of the function blocks and the interconnect matrix of the PLD. Each of the configurable reference generators includes a current mirror whose control current is selectively directed through a series of optional resistors. Each optional resistor is connected in parallel to a pass transistor whose gate is connected to a control bit. By selectively programming the control bits, the pass transistors are controlled to connect or disconnect the optional resistors from the control path of the current mirror, thereby controlling the reference voltage of the configurable reference generator to optimize the speed-versus-power characteristics of the sense amplifiers. The configurable reference generator also includes a second programming circuit which selectively pulls down the reference voltage in response to a programmed state of another control bit, thereby providing further configurability to optimize the speed-versus-power characteristics of the sense amplifiers.

BRIEF DESCRIPTION OF THE DRAWINGS

These and other aspects of the present invention are disclosed in the following description which refers to the appended figures, in which.

DETAILED DESCRIPTION OF THE DRAWINGS

The present invention is described below in relation to a simplified programmable logic device (PLD) which includes circuitry consistent with the Erasable Programmable Logic Devices (EPLDs) disclosed in Section 3 of the 1994 Xilinx Programmable Logic Data Book, which is incorporated by reference herein.

In the following description, the phrase "electrically coupled" is intended to mean that a signal path is formed between the identified elements, and that the elements are either directly connected or connected through one or more signal conditioning elements (including inverters) in the signal path. In contrast, the word "connected" is generally used to indicate a direct connection between identified elements.

One of ordinary skill in the art will recognize that the numbers of, for example, input pins, output pins and interconnect lines of the simplified PLD are significantly less than the numbers found in actual PLDs in order to facilitate clarity in the following description.

Further, one of ordinary skill in the art will recognize that the configurable circuitry described may be incorporated into, for example, field programmable gate arrays (FPGAs) and other known types of PLDs.

Figure 1:
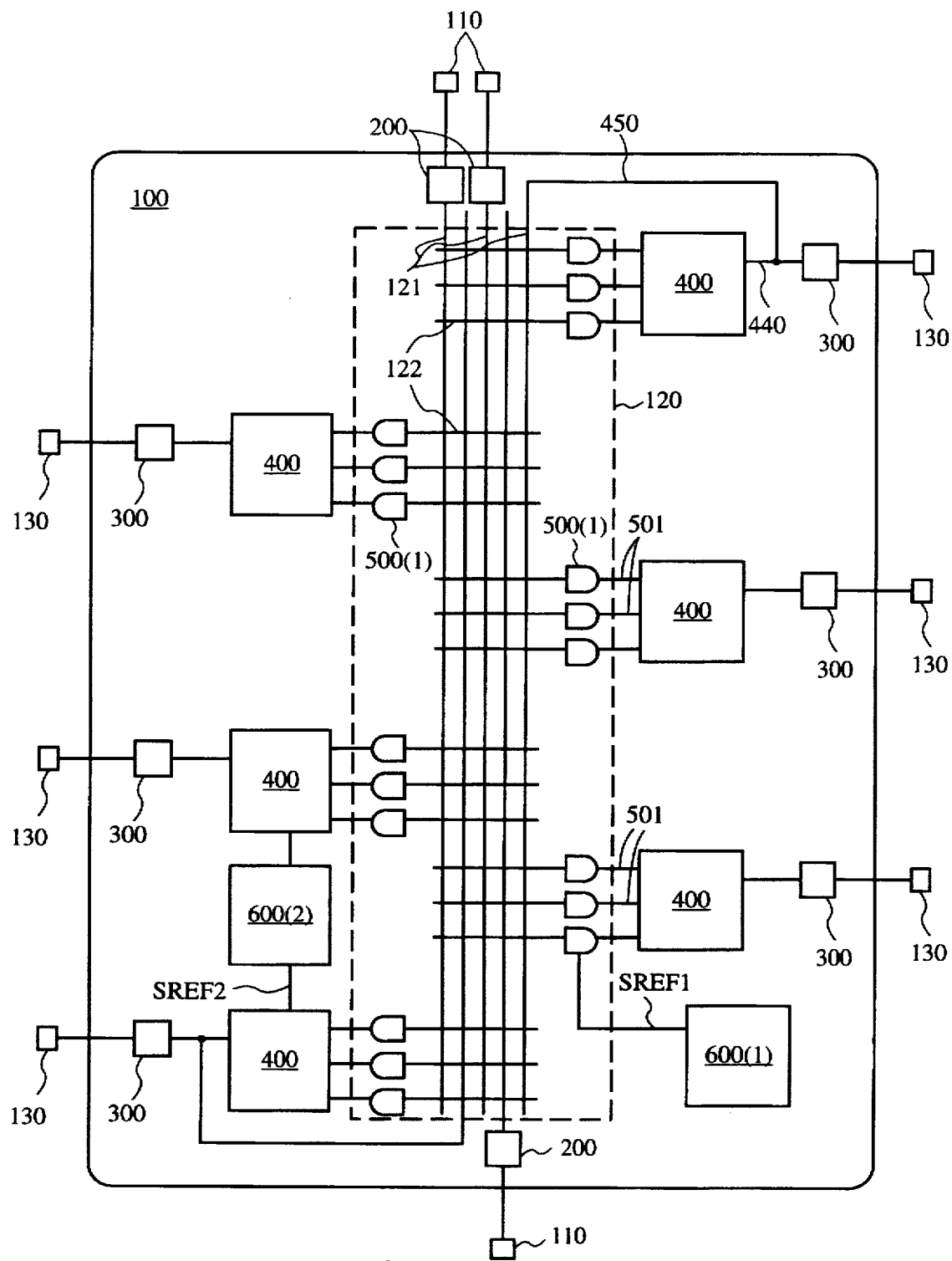
FIG. 1 shows a simplified block diagram of a programmable logic device in accordance with the present invention.

Programmable Logic Device (FIG. 1)

FIG. 1 shows a simplified diagram of a PLD 100 in accordance with the present invention. PLD 100 includes a plurality of input pins 110 through which input signals are entered, for example, into an interconnect matrix 120. Interconnect matrix 120 acts as a programmable switch board to route selected signals to a plurality of function blocks 400. Each function block 400 contains configurable circuitry for generating a desired logic function based on the signals received from interconnect matrix 120. Output signals from function blocks 400 are either fed back into the interconnect matrix 120 on feedback lines 450 or transmitted to output (second) pins 130.

In accordance with a first aspect of the present invention, PLD 100 includes a plurality of configurable input buffers 200, each input buffer 200 being electrically coupled between one input pin 110 and interconnect matrix 120 (although not shown in FIG. 1, one or more input buffers 200 may also be electrically coupled to input pins of function blocks 400 without passing through interconnect matrix 120). As described in greater detail below, the trip-point of each input buffer 200 is adjustable by connecting one or more trip-point adjustment transistors in parallel with dedicated N-channel and P-channel transistors.

In accordance with a second aspect of the present invention, PLD 100 includes a plurality of configurable output buffers 300, each output buffer 300 being electrically coupled between an output line 440 of a function block 400 and an output pin 130 (although not shown, one or more output buffers 300 may be electrically coupled to the interconnect matrix 120 without passing through function block 400). Similar to input buffers 200, the trip-points of output buffers 300 are configurable by connecting one or more trip-point adjustment transistors in parallel with dedicated transistors.

In accordance with a third aspect of the present invention, PLD 100 includes one or more configurable reference generators 600(1) and 600(2) for generating sense amplifier reference voltages SREF1 and SREF2, respectively. Reference voltage SREF1 is applied to sense amplifiers 500(1) located in the interconnect matrix 120, and reference voltage SREF2 is applied to sense amplifiers 500(2) (see FIG. 4) located in function blocks 400.

Figure 2:
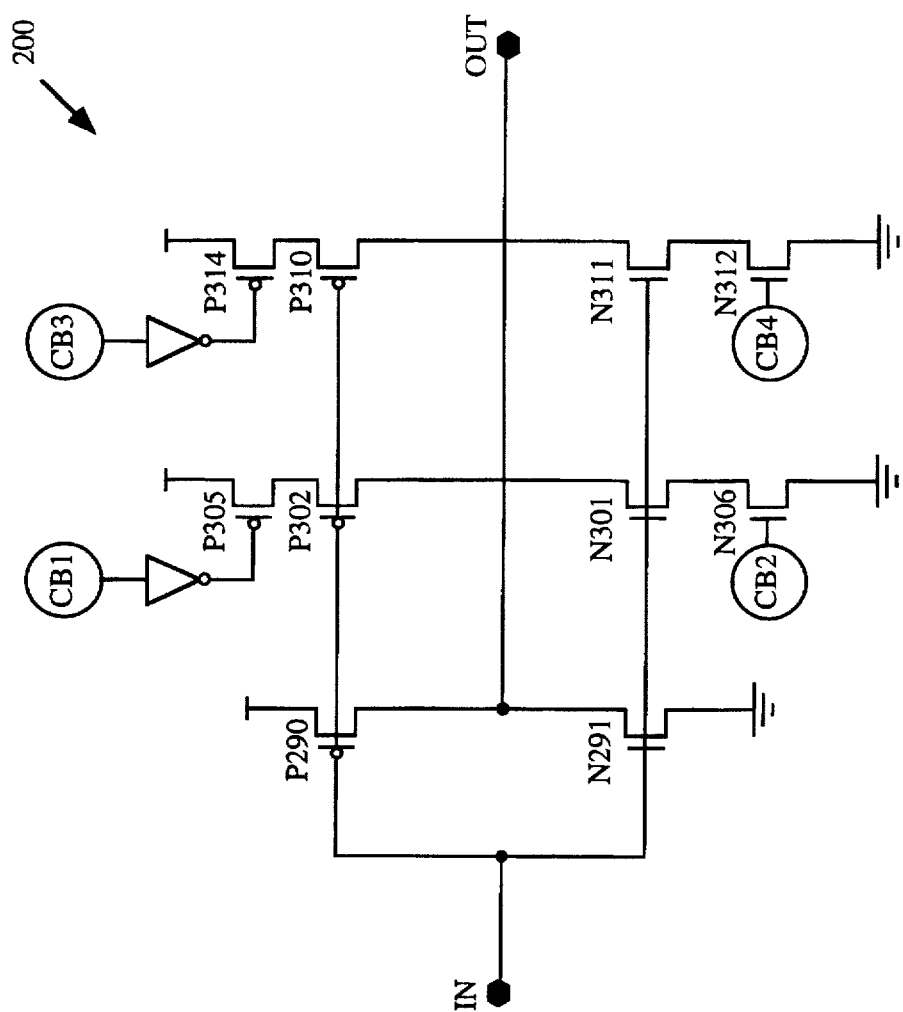
FIG. 2 shows a circuit diagram of a configurable input buffer in accordance with a first aspect of the present invention.

Configurable Input Buffer (FIG. 2)

Referring to FIG. 2, configurable input buffer 200 includes an input terminal IN, which is electrically coupled to an input pin 110 of PLD 100, and an output terminal OUT. Input terminal IN is connected to the gate of a dedicated P-channel transistor P290, and also to the gate of a dedicated N-channel transistor N291. Transistor P290 includes a drain connected to a voltage source Vcc (e.g., 5 volts) and a source connected to output terminal OUT. Transistor N291 includes a drain connected to output terminal OUT and a source connected to ground.

The "trip-point" of input buffer 200 is the input voltage level at which the output voltage at output terminal OUT switches from Vcc to ground, or from ground to Vcc. As shown in FIG. 2, an input signal applied to the input terminal IN is simultaneously transmitted to the gate of transistor P290 and to the gate of transistor N291. When the input signal has a relatively high voltage level, transistor P290 is turned off and transistor N291 is turned on, thereby connecting the output terminal OUT to ground. Conversely, when the input signal is relatively low, transistor P290 is turned on and transistor N291 is turned off, thereby connecting the output terminal OUT to Vcc. The trip-point is the voltage at which, for example, transistor P290 is turned off (disconnecting output terminal OUT from Vcc) and transistor N291 is simultaneously turned on (connecting output terminal OUT to ground).

The ideal trip-point for an input buffer is determined by the type of semiconductor logic in which a PLD is incorporated. Transistor-transistor logic (TTL) input buffers receive input signals which are logic "1s" when the signal voltage is 2.4 volts or greater, and as logic "0s" when the signal voltage is 0.8 volts or less. Thus, the ideal trip-point for TTL input buffers is the approximate midpoint between these voltages, or 1.6 volts.

The trip-point of a prior art input buffer (i.e., an input buffer including only dedicated transistors P290 and N291) is determined by the relative channel widths of the N-channel and P-channel transistors. That is, to produce an input buffer having a particular trip-point, a circuit designer will design the transistor channel widths of the N-channel and P-channel transistors such that a ratio of the N-channel transistor width to the P-channel transistor width (N-to-P ratio) produces the desired trip-point.

The N-to-P ratio of prior art TTL input buffers operating on a 5-volt supply differs from prior art TTL buffers designed to operate on a 3.3-volt supply. To obtain an approximately 1.6 volt trip-point in a prior art 5-volt TTL input buffer (using CMOS technology), it is generally known that the required N-to-P ratio is in the range of 4 to 6; that is, the width of the N-channel transistor is 4W to 6W, where W is the channel width of the P-channel transistor. In contrast, to obtain an approximately 1.6 volt trip-point in a prior art 3.3-volt TTL input buffer (using CMOS technology), it is generally known that the required N-to-P ratio is in the range of 2.5 to 3.5. This difference between the N-to-P ratios for the 3.3-volt and 5-volt TTL input buffers necessitates the use of two masks during production, as discussed in the background (above).

Referring again to FIG. 2, in accordance with the present invention, the effective N-to-P ratio of each input buffer 200 is selectively adjustable using one or more trip-point adjustment transistors. In particular, the effective N-to-P ratio is selectively adjusted by connecting one or more trip-point adjustment transistors in parallel with at least one of dedicated transistors P290 and N291. By changing the effective N-to-P ratio, it is possible to configure input buffer 200 for operation using a secondary operating voltage, such as 3.3 volts. Further, by changing the effective N-to-P ratio, the trip-point of input buffer 200 may be "tweaked" to a desired level.

In the embodiment shown in FIG. 2, input buffer 200 includes P-channel trip-point adjustment transistors P302 and P310 which are connected in parallel with dedicated P-channel transistor P290, and N-channel trip-point adjustment transistors N301 and N311 which are connected in parallel with dedicated N-channel transistor N291. The P-channel trip-point adjustment transistors P302 and P310 are selectively connected to Vcc through P-channel activation transistors P305 and P314, respectively, whose gates are connected through inverters to control bits (memory devices) CB1 and CB3, respectively. The sources of trip-point adjustment transistors P302 and P310 are connected to output terminal OUT. Similarly, the N-channel trip-point adjustment transistors N301 and N311 are selectively connected to ground through N-channel activation transistors N306 and N312, respectively, whose gates are connected to control bits CB2 and CB2, respectively. The sources of trip-point adjustment transistors N301 and N311 are connected to output terminal OUT.

Control bits CB1 through CB4 are preferably random access memory (RAM) cells which are initialized by Flash EPROM cells. In one embodiment, the default condition of CB1 through CB4 is "off" (erased). The default "off" condition produces a low (logic 0) signal at the outputs of control bits CB1 and CB3 which is inverted and applied to the gates of transistors P305 and P314 as a high (logic 1) signal, thereby turning off transistors P305 and P314. Similarly, the default "off" condition of control bits CB2 and CB4 generates a low signal at the gates of transistors N306 and N312, thereby turning off transistors N306 and N312.

In accordance with the present invention, input buffer 200 is configurable by selectively connecting one or more of the trip-point adjustment transistors in parallel with one or more of dedicated transistors P290 and N291. Trip-point transistors P302 and P310 are selectively connected in parallel with dedicated transistor P290 by programming CB1 and CB3, respectively, such that a low (logic 0) signal is applied to the gates of activation transistors P305 and P314, thereby turning activation transistors P305 and P314 "on". With activation transistors P305 and P314 turned "on", Vcc is applied to the drains of trip-point adjustment transistors P302 and P310. In this activated state, a high input signal on input terminal IN turns "on" both dedicated transistor P290 and trip-point adjustment transistors P302 and P310, thereby decreasing the effective N-to-P ratio and producing an associated change in the trip-point voltage level. Likewise, trip-point transistors N301 and N311 are selectively connected in parallel with dedicated transistor N291 by programming CB2 and CB4, respectively, such that a low (logic 0) signal is applied to the gates of activation transistors N306 and N312, thereby turning activation transistors N306 and N312 "on". With activation transistors N306 and N312 turned "on", the drains of trip-point adjustment transistors N301 and N311 are effectively connected to ground. In this activated state, a low input signal on input terminal IN turns "on" both dedicated transistor N291 and trip-point adjustment transistors N301 and N311, thereby increasing the effective N-to-P ratio and producing an associated change in the trip-point voltage level.

The trip-point transistors are preferably sized to produce a variety of N-to-P ratio changes. For example, in one embodiment, trip-point adjustment transistor P302 has a channel width of W/2, and trip-point adjustment transistor P310 has a channel width of W/4, where W is the channel width of dedicated transistor P290. This arrangement theoretically allows the effective P-channel width to be changed to approximately 3W/2 by activating trip-point adjustment transistor P302, to 5W/4 by activating P310, and to 7W/4 by activating both P302 and P310. Of course, the actual effective P-channel widths are somewhat less than these values due to the series connection of activation transistors P305 and P314. For example, to change the effective P-channel width by W/2 through the activation of trip-point adjustment transistor P302, the activation transistors P305 and P314 must have undesirably large channel widths. A currently preferred compromise is to reduce the channel width of activation transistors P305 and P314 to mW, where m is in the range of 2 to 3, thereby producing an effective P-channel width change which is within a desirable range.

In contrast to the P-channel transistors, trip-point adjustment transistor N301 and activation transistor N306 preferably have channel widths which are equal to the channel width of dedicated N-channel transistor N291. Therefore, the series connection of transistors N301 and N306 produces an nW/2 increase in the effective N-channel width (where nW is the width of dedicated N-channel transistor N291). Similarly, trip-point adjustment transistor N311 and activation transistor N312 preferably have channel widths which are equal to nW/2. Therefore, the series connection of transistors N311 and N312 produces an nW/4 increase in the effective N-channel width. Finally, by activating both trip-point adjustment transistors N301 and N311, the effective N-channel width is increased by 7W/4.

In other embodiments of the present invention, the number of trip-point adjustment transistors is more or less than the four transistors shown in the embodiment of FIG. 2. As is apparent, providing additional trip-point adjustment transistors of various channel widths facilitates precise trip-point adjustment.

Figure 3:
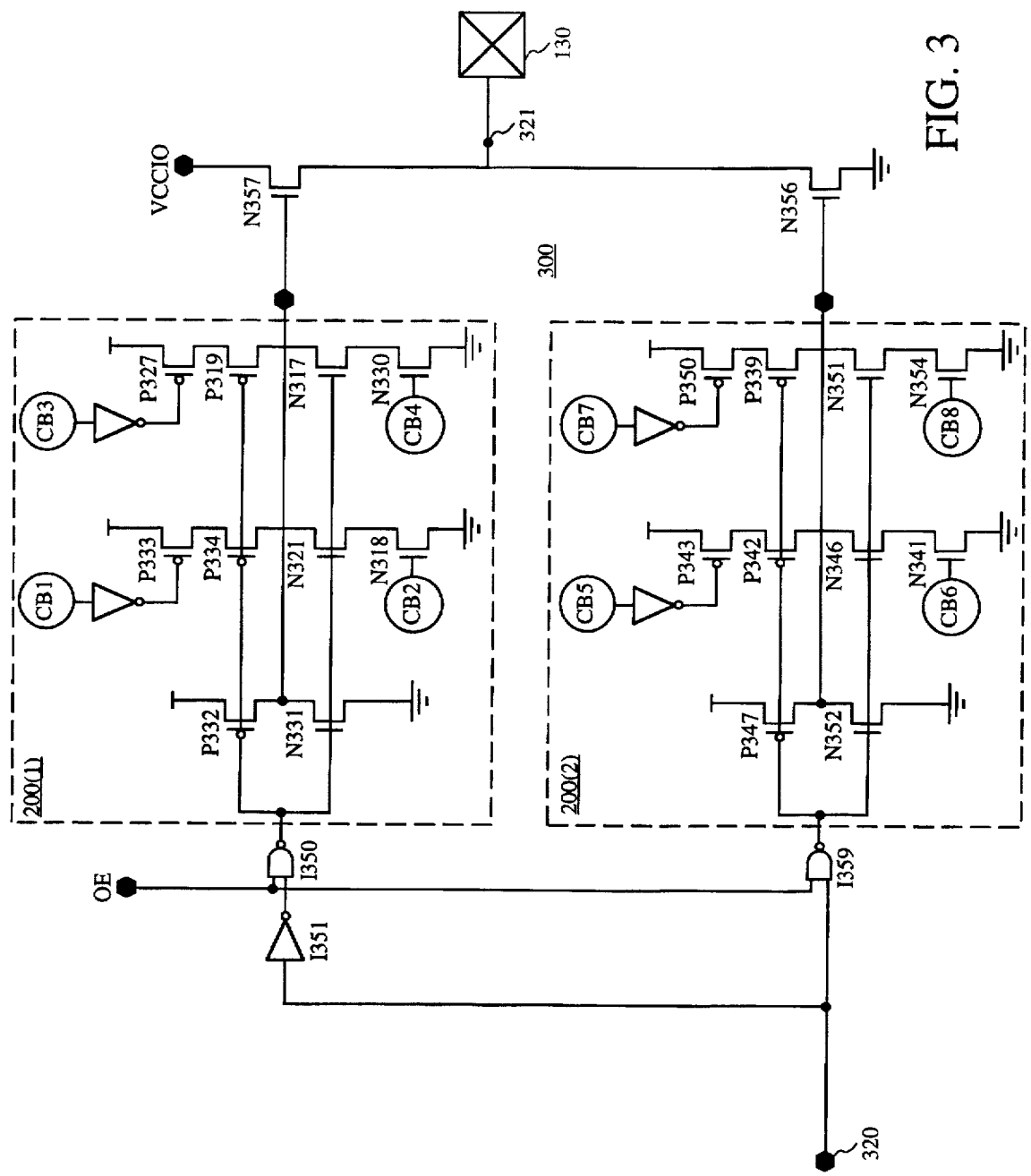
FIG. 3 shows a circuit diagram of a configurable output buffer in accordance with a second aspect of the present invention.

Configurable Output Buffer (FIG. 3)

FIG. 3 shows a configurable output buffer 300 for controlling the voltage level of an output signal applied on an output pin 130 of the PLD 100 (see FIG. 1).

Configurable output buffer 300 includes an input terminal 320, which is typically electrically coupled to a macrocell output of a function block 400 of the PLD 100, and an output terminal 321 which is connected to an output pin 130 of the PLD 100. The voltage level at output terminal 321 is controlled by N-channel transistors N356 and N357 in response to input signals received at input terminal 320 and by an output enable signal OE. When output enable signal OE is high, the voltage level of the input signal alternately turns on transistors N356 and N357 to connect output terminal 321 to ground or $V_{CCIO}$, respectively. When output enable signal OE is low, both transistors N356 and N357 are turned off.

In accordance with one embodiment of the present invention, transistors N357 and N356 are respectively controlled by a pair of configurable buffers 200(1) and 200(2). Configurable buffer 200(2) receives the input signal from input terminal 320 through a NAND gate I359. Similarly, configurable buffer 200(1) receives a complement of the input signal from input terminal 320 through inverter I351 and NAND gate I350. Output enable signal OE is applied to NAND gates N350 and N359 and acts as a switching signal to control the output buffer 300. That is, when output enable signal OE is high, the NAND gates I350 and I359 generate complementary output signals in response to the input signal. However, when output enable signal OE is low, both NAND gates I350 and I359 generate constant high output signals which in turn are inverted by configurable buffers 200(1) and 200(2) to turn off transistors N357 and N356, respectively.

Configurable buffers 200(1) and 200(2) are similar to configurable input buffer 200 (described above) in that configurable buffers 200(1) and 200(2) include one or more trip-point adjustment transistors for altering the effective N-to-P ratio of the respective buffers. Similar to configurable input buffer 200, the purpose of configurable buffers 200(1) and 200(2) is to adjust the effective N-to-P ratio of output buffer 300 to configure PLD 100 for either high-speed operation or low-power operation. However, unlike configurable input buffers 200, the operating voltages associated with configurable buffers 200(1) and 200(2) are not changed. Therefore, the channel widths of the trip-point adjustment transistors and activation transistors of configurable buffers 200(1) and 200(2) are typically smaller than those of the configurable input buffer 200. In one embodiment, each of dedicated transistors P332, N331, P347, N352 and activation transistors P335, P327, N318, N330, P343, P350, N341 and N354 have a common channel width W, trip-point adjustment transistors P334, N321, P342 and N346 have a channel width of W/2, and trip-point adjustment transistors P319, N317, P339 and P351 have a channel width of W/4. The arrangement of the various transistors of configurable buffers 200(1) and 200(2) is otherwise identical to that of configurable input buffer 200, and further description of these buffers will therefore be omitted.

The operation of output buffer 300 will now be described. Input signals (typically from macrocells 400) are applied to input terminal 320. A high input signal is applied to a first terminal of NAND gate I359 and is inverted and applied to NAND gate I350. If output enable signal OE is high, then NAND gate I350 transmits a low signal to the input of first configurable buffer 200(1), and NAND gate I359 applies a low signal to the input of configurable buffer 200(2). Each configurable buffer 200(1) and 200(2) inverts the respective signals applied to their input terminals. Therefore, a low signal is transmitted from the output of configurable buffer 200(1) which is applied to the gate of N-channel transistor N357. Similarly, the low signal applied to the input of configurable buffer 200(2) is inverted and applied as a high output signal on the gate of transistor N356, thereby turning N356 on and connecting output pin 130 to ground.

Conversely, when a low input signal is applied to input terminal 320 of configurable output buffer 300, configurable buffer 200(1) applies a high signal to the gate of transistor N357, and configurable buffer 200(2) applies a low signal to the gate of transistor N356. This turns on transistor N357, thereby connecting voltage $V_{CCIO}$ to output pin 310.

Similar to the explanation above with respect to input buffer 200, the trip-point of each configurable buffer 200(1) and 200(2) is adjustable to optimize the speed-versus-power characteristics of output buffer 300 for use in high-speed or low-power configurations. For example, when high-speed operation is desired, one or more of the trip-point adjustment transistors is activated to produce strong P-channel and N-channel transistors. The precise amount and extent to which the trip-point adjustment transistors modify the trip-point of configurable buffers 200(1) and 200(2) depends upon the number and size of the trip-point adjustment transistors.

Configurable Reference Generator

Referring back to FIG. 1, in accordance with the third aspect of the present invention, the PLD 100 includes configurable reference generators 600(1) and 600(2) which generate sense amplifier reference voltages SREF1 and SREF2 which are respectively transmitted to the sense amplifiers 500(1) located in interconnect matrix 120 and to sense amplifiers 500(2) located in function blocks 400.

Figure 4:
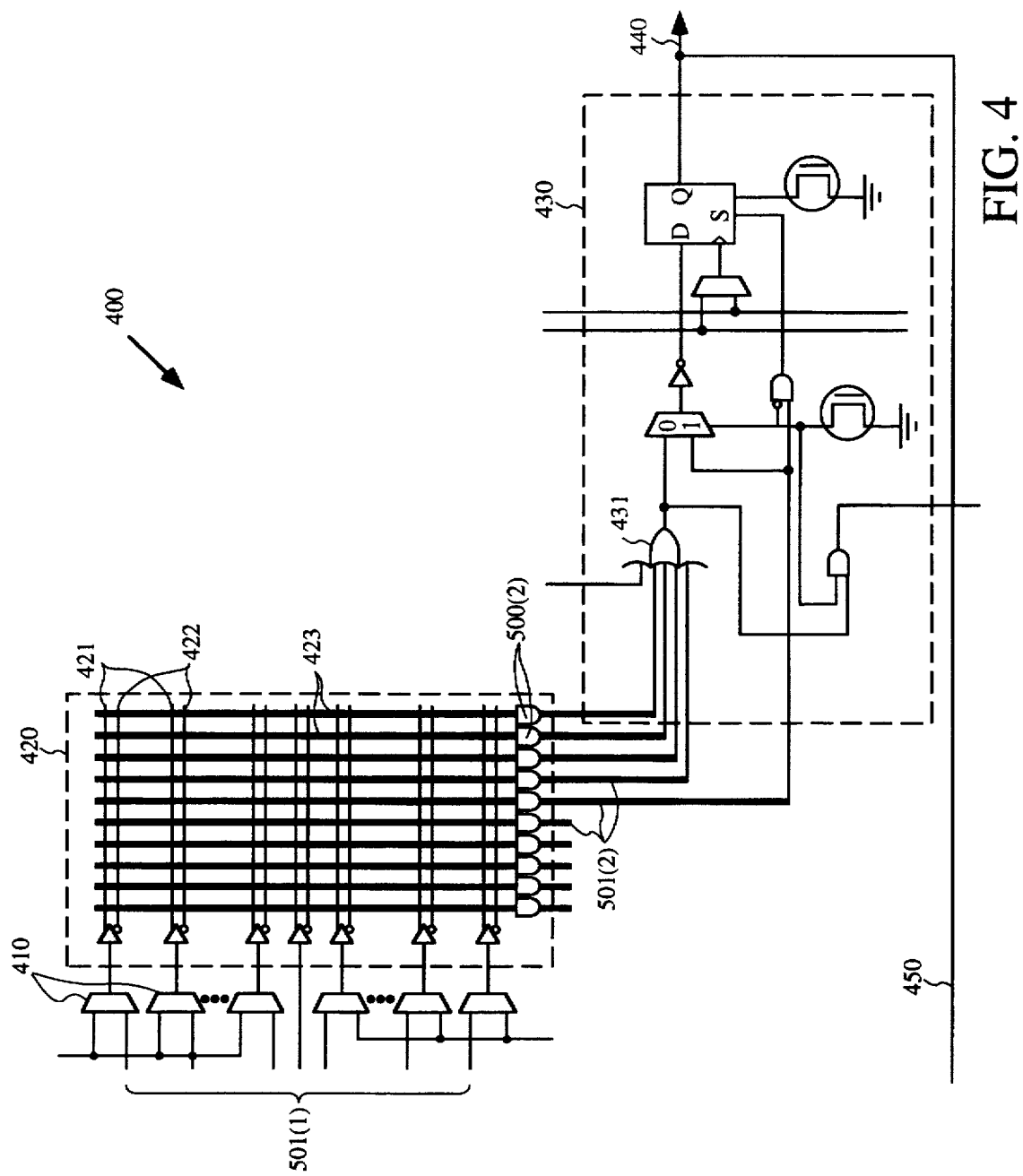
FIG. 4 shows a circuit diagram of a function block of the programmable logic device shown in FIG. 1.

FIG. 4 shows an example of a function block 400. Each function block 400 includes a number of input lines connected to output lines 501(1) of sense amplifiers 500(1) (FIG. 1) of interconnect matrix 120. In accordance with the disclosed embodiment, the signals on the output lines 501(1) are gated through MUXes 410 to an AND array 420. Within the AND array 420, each of the input signals is transmitted on word lines 421 and 422 in non-inverted and inverted forms, respectively. Word lines 421 and 422 are programmably coupled to bit lines 423, which in turn are applied to sense amplifiers 500(2). Output signals from the sense amplifiers 500(2) are transmitted to one or more macrocells 430 on lines 501(2). Each macrocell 403 contains at least one OR gate 431 for generating sum-of-products output signals. These output signals are either applied to adjacent macrocells in function block 400, are transmitted through output 440 to an output buffer 300, or are fed back to interconnect matrix 120 on feedback lines 450.

Function block 400 is based on function blocks disclosed and discussed in Section 3 of The Programmable Logic Data Book published by Xilinx, Inc. (1994). However function block 400 is modified from those shown in the Data Book to simplify the present description. Additional information regarding the operation and content of the logic modules shown in FIG. 4 may be found in Section 3 of The Programmable Logic Data Book.

Referring again to FIG. 1, in accordance with the preferred embodiment, reference voltage SREF1 is transmitted to sense amplifiers 500(1) located in the interconnect matrix 120. Input signals and feedback signals are input into the interconnect matrix 120 on word lines 121 which are programmably connectable to a plurality of bit lines 122. By programming the interconnect matrix 120 to provide two or more input and/or feedback signals onto a single bit line 122, these signals are logically "ANDed" together, thereby transmitting a product term to a selected function block 400. To implement this operation, a sense amplifier 500(1) is provided on each bit line 122. Outputs 501(1) from sense amplifiers 500(1) are provided as inputs to function blocks 400.

Figure 5:
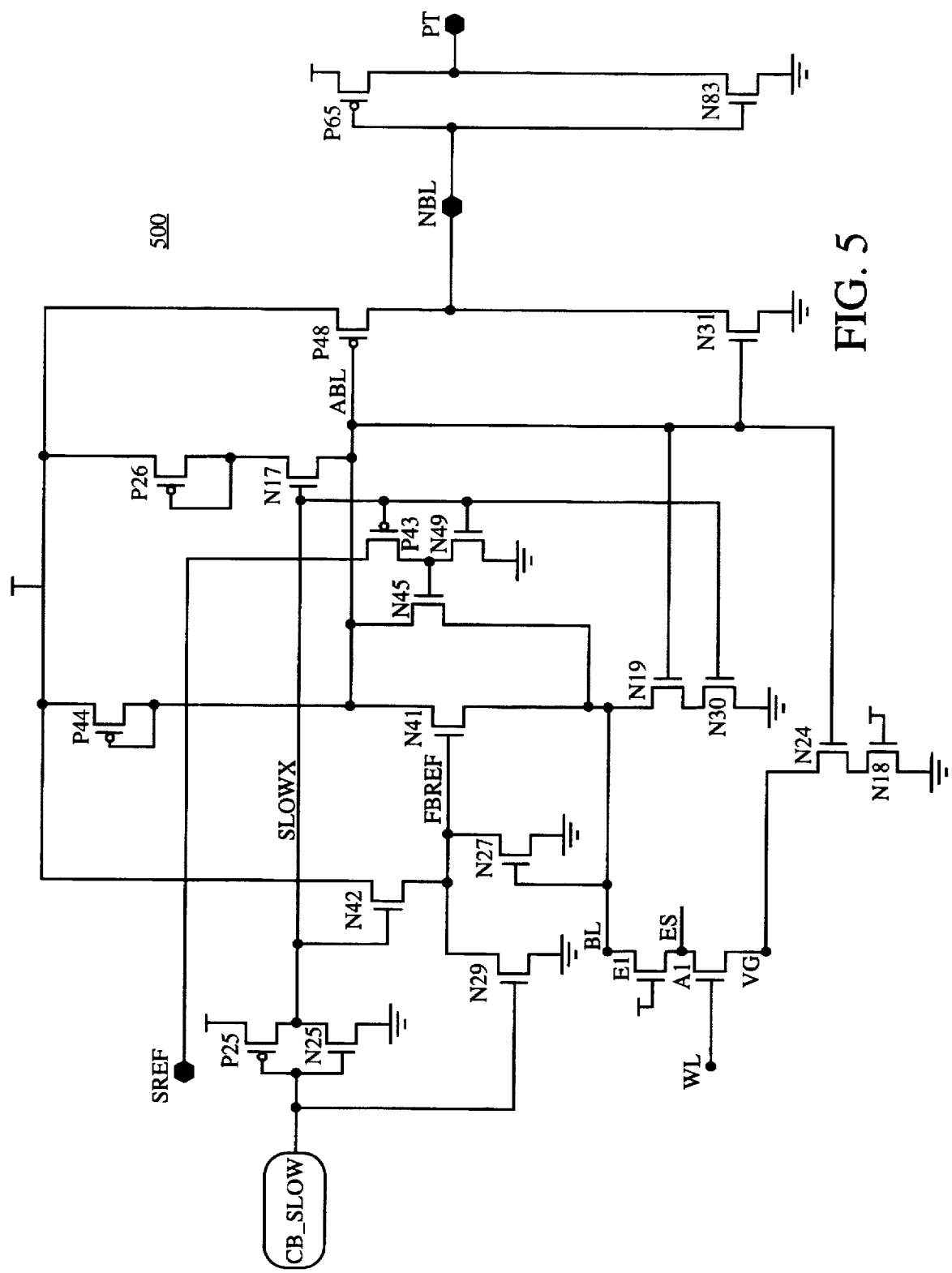
FIG. 5 shows a circuit diagram of a sense amplifier used in the interconnect matrix and the function blocks of the programmable logic device shown in FIG. 1.

FIG. 5 shows an example of sense amplifier 500 for receiving the reference voltage SREF generated by the configurable reference generator 600 (described below). Sense amplifier 500 is exemplary of the sense amplifiers 500(1) of interconnect matrix 120 and sense amplifiers 500(2) of function blocks 400. Sense amplifier 500 is described in significant detail in U.S. application Ser. No. 08/459,066, filed on Jun. 2, 1995, entitled "Sense Amplifier Programmable Logic Device Having Selectable Power Modes" [Attorney Docket No. X-152/1P/M-3372], which is owned by the assignee of the present application and is incorporated herein by reference.

Figure 6:
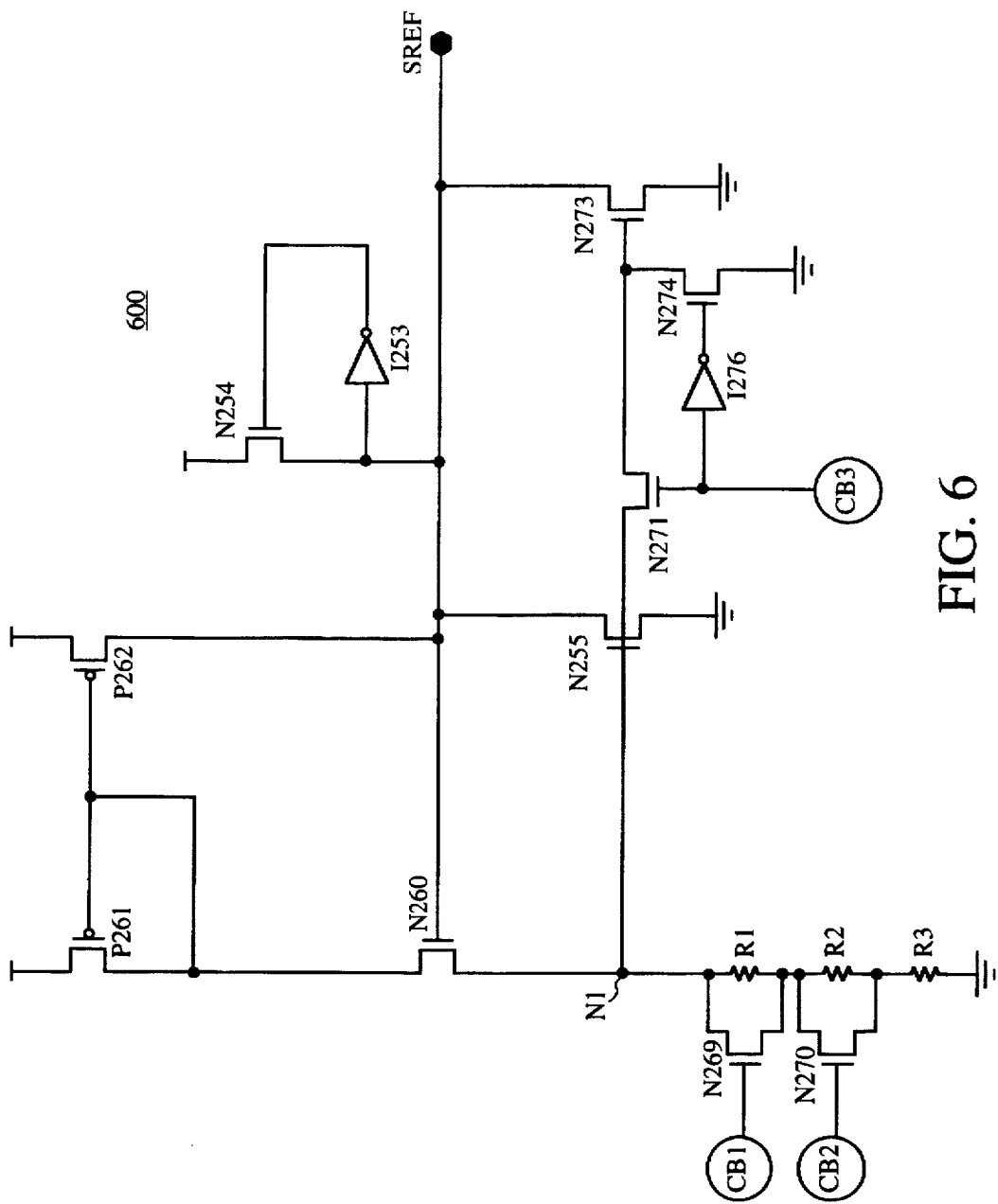
FIG. 6 shows a circuit diagram of a configurable reference voltage generator in accordance with a third aspect of the present invention.

FIG. 6 shows a configurable reference generator 600 for generating either reference voltage SREF1 or reference voltage SREF2. Specifically, configurable reference generator 600 is exemplary of configurable reference generator 600(1) which transmits SREF1 to sense amplifiers 500(1) of interconnect matrix 120, and of configurable reference generator 600(2) which transmits SREF2 to sense amplifiers 500(2) of function blocks 400.

Configurable reference generator 600 includes a current mirror comprising P-channel transistors P261 and P262, with the control current through transistor P261 being applied across N-channel transistor N260 and series resistors R1, R2 and R3. Resistors R1 and R2 are respectively connected in parallel with N-channel transistors N269 and N270, which in turn are controlled by control bits CB1 and CB2, respectively. In a default state, control bits CB1 and CB2 apply low (logic 0) signals to the gates of transistors N269 and N270, thereby turning these transistors off and connecting resistors R1 and R2 in series with resistor R3. In this default setting, reference voltage SREF is at its lowest possible voltage. When one or both control bits CB1 and CB2 are programmed to apply a high signal to the gate of transistors N269 and N270, respectively, these transistors are turned on such that the control current bypasses one or both resistors R1 and R2 (transistors N269 and N270 are sized such that their respective resistances are insignificant compared to resistors R1 and R2). By bypassing one or more of resistors R1 and R2, the resistance in the control current of the current mirror is reduced, thereby increasing reference voltage SREF.

In addition, N-channel transistor N260 and N-channel transistor N255 are provided to maintain reference voltage SREF at a constant level. Reference voltage SREF is applied to the gate of N-channel transistor N260, whose source is connected to node N1, which is located between the source of transistor N260 and resistor R1. Node N1 is connected to the gate of N-channel transistor N255. As reference voltage SREF increases, conduction through transistor N260 is increased, thereby increasing the voltage applied to the gate of transistor N255. As this voltage increases, the conduction through transistor N255 is increased, thereby pulling reference voltage SREF down to the desired level.

An additional programming source for reducing reference voltage SREF is provided by N-channel transistors N271, N273 and N274. Transistor N273 is connected in parallel with transistor N255 such that when N273 is turned on, the reference voltage SREF is decreased. The parallel connection of transistor N273 is provided through transistor N271, whose gate is connected to control bit CB3. When control bit CB3 applies a high signal to the gate of transistor N271, transistors N255 and N273 are connected in parallel. However, when control bit CB3 applies a low signal to transistor N271, transistor N271 is turned off and transistor N274, which is connected to control bit CB3 through inverter I276, is turned on. When transistor N274 is turned on, the gate of transistor N273 is connected to ground.

Finally, N-channel transistor N254 and inverter I253 are provided as a pull-up mechanism to prevent reference voltage SREF from undesirably dropping to ground.

In accordance with the present invention, reference voltage SREF is adjusted by selectively programming control bits CB1 and CB2 to bypass resistors R1 and R2, respectively. By selectively bypassing resistors R1 and R2, the control voltage of the current mirrors formed by transistors P261 and P262 is adjusted to fine tune the reference voltage SREF.

Although the present invention has been described in considerable detail with reference to certain preferred versions thereof, other versions are possible. For example, the type of control bits and transistor channel widths of the configurable buffers may be altered. Further, the number of trip-point adjustment transistors may be increased to allow fine tuning of the trip-point. Further, the number of resistors associated with the configurable reference generator 300 may be altered for similar purposes. Therefore, the spirit and scope of the appended claims should not be limited to the description of the preferred versions contained herein.

We claim:

1. A programmable logic device comprising:
   an input pin for receiving an input signal;
   a function block including an input terminal which is programmably coupled to the input pin, the function block including circuitry which is programmable to implement a desired logic function; and
   a configurable input buffer including:
   an input terminal connected to the input pin;
   a first transistor having a gate connected to the input terminal, a first terminal connected to a voltage source, and a second terminal;
   a second transistor having a gate connectable to the voltage source, a first terminal connected to the voltage source, and a second terminal;
   a third transistor having a gate connected to the input terminal, a first terminal connected to the second terminal of the second transistor, and a second terminal; and an output terminal connected to the second terminals of the first and third transistors.

2. The programmable logic device according to claim 1, wherein the gate of the second transistor is connectable to the voltage source through a first memory device, and wherein the configurable input buffer further comprises:

a fourth transistor having a gate connected to the input terminal, a first terminal connected to the output terminal, and a second terminal connected to ground;

a second memory device;

a fifth transistor having a gate connected to the second memory device, a first terminal, and a second terminal connected to ground; and a sixth transistor having a gate connected to the input terminal, a first terminal connected to the output terminal, and a second terminal connected to the first terminal of the fifth transistor;

wherein the fifth transistor is controlled by a programmed state of the second memory device to connect the second terminal of the sixth transistor to ground.

3. The programmable logic device according to claim 2, wherein the configurable input buffer further comprises:

a third memory device;

a seventh transistor having a gate connected to the third memory device, a first terminal connected to the voltage source, and a second terminal; and a eighth transistor having a gate connected to the input terminal, a first terminal connected to the second terminal of the seventh transistor, and a second terminal connected to the output terminal;

wherein the seventh transistor is controlled by a programmed state of the third memory device to connect the first terminal of the eighth transistor to the voltage source.

4. The programmable logic device according to claim 3, wherein the configurable input buffer further comprises:

a fourth memory device;

a ninth transistor having a gate connected to the fourth memory device, a first terminal, and a second connected to ground; and a tenth transistor having a gate connected to the input terminal, a first terminal connected to the output terminal, and a second terminal connected to the first terminal of the ninth transistor;

wherein the ninth transistor is controlled by a programmed state of the fourth memory device to connect the second terminal of the tenth transistor to ground.

5. The programmable logic device according to claim 3, wherein a drain-to-source resistance of the third transistor is greater than a drain-to-source resistance of the eighth transistor.

6. The programmable logic device according to claim 4, wherein a drain-to-source resistance of the sixth transistor is greater than a drain-to-source resistance of the tenth transistor.

7. The programmable logic device according to claim 4, wherein the first, second, third and fourth memory devices comprise Flash EPROMs.

8. The programmable logic device according to claim 4, wherein the first, second, third, seventh and eighth transistors are P-channel transistors; and wherein the fourth, fifth, sixth, ninth and tenth transistors are N-channel transistors.

9. A programmable logic device comprising:

an output pin;

a function block including an output terminal which is programmably electrically coupled to the output pin, the function block including circuitry which is programmable to implement a desired logic function; and an output buffer including:

an input terminal connected to the output terminal of the function block;

first and second configurable buffers respectively having input terminals respectively connected to receive complementary signals from the input terminal, each of the first and second configurable buffers having an output terminal;

a first transistor having a gate connected to the output terminal of the first configurable buffer, a first terminal connected to a first voltage source, and a second terminal connected to the output pin; and a second transistor having a gate connected to the output terminal of the second configurable buffer, a first terminal connected to the output pin, and a second terminal connected to ground;

wherein each of the first and second configurable buffers includes:

a third transistor having a gate connected to receive a first complementary signal, a first terminal connected to a second voltage source, and a second terminal connected to the output terminal;

a first memory device;

a fourth transistor having a gate connected to the first memory device, a first terminal connected to the second voltage source, and a second terminal;

a fifth transistor having a gate connected to the receive said first complementary signal, a first terminal connected to the second terminal of the fourth transistor, and a second terminal connected to the output terminal; and wherein the fourth transistor is controlled by a programmed state of the first memory device to connect the first terminal of the fifth transistor to the second voltage source.

10. The programmable logic device according to claim 9, wherein each of the first and second configurable buffers further comprises:

a sixth transistor having a gate connected to receive a second complementary signal, a first terminal connected to the output terminal, and a second terminal connected to ground;

a second memory device;

a seventh transistor having a gate connected to the second memory device, a first terminal, and a second terminal connected to ground; and an eighth transistor having a gate connected to receive the second complementary signal, a first terminal connected to the output terminal, and a second terminal connected to the first terminal of the seventh transistor;

wherein the seventh transistor is controlled by a programmed state of the second memory device to connect the second terminal of the eighth transistor to ground.

11. The programmable logic device according to claim 10, wherein the first and second memory devices comprise Flash EPROMs.

12. The programmable logic device according to claim 10, wherein the third, fourth and fifth transistors are P-channel transistors; and wherein the first, second, sixth, seventh and eighth transistors are N-channel transistors.

13. The programmable logic device according to claim 9, further comprising:

a first NAND gate having a first input connect to the input terminal and an output connected to the input terminal of the first configurable buffer;

an inverter; and a second NAND gate having a first input connected to the input terminal through the inverter, and an output connected to the input terminal of the second configurable buffer.

14. A programmable logic device comprising:

an input pin for receiving an input signal;

a function block including an input terminal which is programmably electrically coupled to the input pin, the function block including a programmable AND array including a plurality of sense amplifiers; and a configurable reference generator for generating a reference voltage on an output terminal which is transmitted to the sense amplifiers of the function block, the configurable reference generator including:

a current mirror circuit including a control current path;

a first resistor programmably connected to the control current path;

a memory device; and a transistor having a gate connected to the memory device, the transistor being connected in parallel with the first resistor such that when the memory device is in a first programmed state, the transistor is turned off and the resistor is connected to the control current path, and when the memory device is in a second programmed state, the transistor is turned on such that the control current path bypasses the resistor.

15. The programmable logic device according to claim 14, wherein the configurable reference generator further comprises a second transistor connected in the control current path between the current mirror circuit and the resistor, the second transistor having a gate connected to the output terminal.

16. The programmable logic device according to claim 14, wherein the configurable reference generator further comprises a third transistor having a first terminal connected to the output terminal, a second terminal connected to ground, and a gate connected to a node located between the second transistor and the resistor.

17. The programmable logic device according to claim 16, wherein the configurable reference generator further comprises:

a fourth transistor connected in parallel with the third transistor, the fourth transistor having a gate connected to the node located between the second transistor and the resistor;

a second memory device;

a sixth transistor having a gate connected to the second memory device, the sixth transistor being connected between the gates of the third and fourth transistors;

an inverter; and a seventh transistor having a gate connected to the second memory device through the inverter, the seventh transistor having a first terminal connected between the fifth transistor and the gate of the fourth transistor, and a second terminal connected to ground.

18. The programmable logic device according to claim 15, further comprising an interconnect matrix connected to the input pin, the interconnect matrix being programmable to route a selected signal to the input terminal of the function block on a bit line, the bit line including a second sense amplifier;

wherein the reference voltage generated by the configurable reference generator is transmitted to the second sense amplifier of the interconnect matrix.

* * * * *

UNITED STATES PATENT AND TRADEMARK OFFICE
CERTIFICATE OF CORRECTION

PATENT NO. : 5,801,548
DATED : September 01, 1998
INVENTOR(S) : Napoleon W. Lee et al.

It is certified that error appears in the above-identified patent and that said Letters Patent is hereby corrected as shown below:

Title page,
Please add -- Assignee: Xilinx, Inc., San Jose, Calif. --

Signed and Sealed this

Twentieth Day of November, 2001

Attest:

NICHOLAS P. GODICI
*Attesting Officer*     *Acting Director of the United States Patent and Trademark Office*